(12) United States Patent
Zhu et al.

(10) Patent No.: US 12,365,579 B2
(45) Date of Patent: Jul. 22, 2025

(54) DISTRIBUTED MEMS SWITCH ARRAY DESIGN WITH MULTIPLE INPUT/OUTPUT PORTS

(71) Applicant: Menlo Microsystems, Inc., Irvine, CA (US)

(72) Inventors: Xu Zhu, Belmont, MA (US); Hajime Terazawa, Carlsbad, CA (US); Chris Nassar, Ballston Spa, NY (US)

(73) Assignee: Menlo Microsystems, Inc., Irvine, CA (US)

( * ) Notice: Subject to any disclaimer, the term of this patent is extended or adjusted under 35 U.S.C. 154(b) by 497 days.

(21) Appl. No.: 17/806,130

(22) Filed: Jun. 9, 2022

(65) Prior Publication Data

US 2023/0202831 A1    Jun. 29, 2023

Related U.S. Application Data

(60) Provisional application No. 63/266,117, filed on Dec. 29, 2021.

(51) Int. Cl.
*H01H 59/00* (2006.01)
*B81B 3/00* (2006.01)

(52) U.S. Cl.
CPC ...... *B81B 3/0018* (2013.01); *B81B 2201/018* (2013.01); *B81B 2207/053* (2013.01); *H01H 59/0009* (2013.01)

(58) Field of Classification Search
CPC .............. H01H 59/0009; H01H 59/00; H01H 2001/0084; B81B 3/0018; B81B 2201/018; B81B 2207/053
USPC ............ 200/181; 257/415, 794, 704; 335/78
See application file for complete search history.

(56) References Cited

U.S. PATENT DOCUMENTS 7,170,155 B2    1/2007  Heck et al.
7,312,678 B2 *  12/2007  Ning ................. H01H 59/0009
                                                    335/78

(Continued)

FOREIGN PATENT DOCUMENTS

WO    2023/129815 A1    7/2023

OTHER PUBLICATIONS

International Search Report and Written Opinion received for PCT Patent Application No. PCT/US2022/081628, mailed on Apr. 26, 2023, 16 pages.

(Continued)

*Primary Examiner* — William A Bolton
(74) *Attorney, Agent, or Firm* — Hamilton, Brook, Smith & Reynolds, P.C.

(57) ABSTRACT

A micro-relay switch array may comprise an array of micro-relays disposed on a substrate, and a cap disposed over the array of micro-relays, thereby encapsulating the array of micro-relays. The micro-relay switch array may further comprise an array of through-substrate vias (TSVs) associated with the array of micro-relays, arranged such that columns of TSVs alternate with columns of micro-relays, and a plurality of device electrical conductors, each of which electrically couples one of the TSVs of the array of TSVs directly to at least two of the micro-relays. The micro-relay switch array may further comprise a plurality of TSV electrical conductors, each of which electrically couples at least two TSVs together. Each micro-relay of the array of micro-relays may be a micro-electromechanical system (MEMS) switch. The substrate and cap may be glass, and the TSVs may be through-glass vias.

20 Claims, 16 Drawing Sheets
(15 of 16 Drawing Sheet(s) Filed in Color)

(56) References Cited

U.S. PATENT DOCUMENTS

| | | | |
|---|---|---|---|
| 7,324,350 B2 | 1/2008 | Heck et al. | |
| 7,663,456 B2 | 2/2010 | Subramanian et al. | |
| 8,576,029 B2 | 11/2013 | Kishore et al. | |
| 9,048,053 B2* | 6/2015 | Morihara | H01H 59/0009 |
| 9,466,532 B2* | 10/2016 | Chu | H01L 21/76898 |
| 10,068,733 B2* | 9/2018 | Liu | H01H 47/02 |
| 10,118,819 B2* | 11/2018 | Cattani | H04R 3/12 |
| 10,326,200 B2* | 6/2019 | Iannotti | H01P 5/028 |
| 10,784,066 B2* | 9/2020 | Koul | H01H 59/0009 |
| 11,148,935 B2* | 10/2021 | Zhu | B81C 1/00293 |
| 2004/0113713 A1 | 6/2004 | Zipper et al. | |
| 2007/0132044 A1 | 6/2007 | Jung et al. | |
| 2007/0139145 A1 | 6/2007 | Subramanian et al. | |
| 2011/0127853 A1 | 6/2011 | Fujita et al. | |
| 2011/0308924 A1 | 12/2011 | Kishore et al. | |
| 2014/0184352 A1 | 7/2014 | Morihara et al. | |
| 2014/0253260 A1 | 9/2014 | Horimoto et al. | |
| 2016/0172112 A1 | 6/2016 | Knipe et al. | |
| 2020/0102213 A1* | 4/2020 | Haridas | H01H 59/0009 |
| 2020/0161062 A1 | 5/2020 | Muri et al. | |

OTHER PUBLICATIONS

Lee, J. Y., et al., "Through-glass copper via using the glass reflow and seedless electroplating processes for wafer-level RF MEMS packaging", Journal of Micromechanics and Microengineering, vol. 23, 2013.

* cited by examiner

DISTRIBUTED MEMS SWITCH ARRAY DESIGN WITH MULTIPLE INPUT/OUTPUT PORTS

RELATED APPLICATION

This application claims the benefit of U.S. Provisional Application No. 63/266,117, filed on Dec. 29, 2021. The entire teachings of the above application are incorporated herein by reference.

BACKGROUND

It is well known to use a mechanical switch to selectively direct electrical current from an electrical source to a load such as an electrical light. FIG. 1 shows an example of such an arrangement where a switch 10 is placed in series between an electrical source 12 and a load 14. The load 14 may be, for example, an overhead light in a building, the source 12 may be 110 VAC power in the building, and the switch 10 is used by an occupant of the building to turn the light on and off by physically manipulating the mechanical switch. The switch in this example is a two-terminal device, with terminals T1 and T2 shown.

Traditional mechanical switches are bulky and require additional design and construction to be able to be integrated with electronic control systems. Excess operation power is required to maintain the mechanical switch locked in the proper position. The semiconductor switch devices are small in term of form factor, but must deal with high conduction resistance because the conduction is through semiconducting channels as compared to ohmic contact of mechanical switch, which produces excessive induced heat during operation. Micro-relays based on micro-electromechanical system (MEMS) technology has merits of both mechanical switches (e.g., low resistance metal ohmic contact) and semiconductor switches (e.g., small size and low operation power consumption).

In many situations, it may be desirable to replace the two-terminal mechanical switch 10 with an electrically-controllable MEMS switch. Due to the small size of a MEMS switch, the current handling capability of each MEMS switch element is limited, so multiple parallel-connected MEMS devices may be employed to handle relatively large current.

SUMMARY

The embodiments described herein are directed to a distributed MEMS switch array device with multiple input/output ports for handling AC/DC high-current and high-power applications. Rather than using a single switch element to shoulder on/off duty, a MEMS switch element array spreads out the controlled current to multiple switch elements. Electrically-controllable switch arrays in the prior art typically join all the switch element terminals together, on the device substrate, to yield single input/output connection. This on-substrate coupling is done to facilitate a goal of minimizing device input/output (I/O).

The described embodiments connect groups of MEMS elements to local vias, e.g., through-glass vias, or TGVs, although other materials through which a via may pass may alternatively be used, thereby forming (more generally) a through-substrate via (TSV). The ratio of MEMS elements to TGVs is relatively low (e.g., 3:1 to 6:1), resulting in a substantial number of TGVs on the MEMS switch array device. The TGVs may be electrically coupled outside of the MEMS switch array device, either in the final product module with or without control electronics, e.g., on lead frame or laminated substrate (printed circuit board or PCB), or integrated in the end users/customers' products/systems with their components.

A benefit of this approach is that thermal heat generated from the contact resistance of each MEMS switch element is evenly distributed across the device and is conveyed out of the device by conduction through multiple metal conducting paths that consist of short metal interconnections and nearby TGVs, as well as passing through device substrate to the ambient. The multiple metal conducting paths enhance the device's thermal handling capability.

Prior art device manufacturers have not been motivated to remove device interconnect from component substrates. Just the opposite—prior art systems have been driven to more interconnect on the device die to reduce overall device I/O pin count. Further, a tendency toward higher integration has driven more and more functionality on-chip, which naturally increases the on-chip interconnections.

In one aspect, the invention may be a micro-relay switch array, comprising an array of micro-relays disposed on a substrate, and a cap disposed over the array of micro-relays that encapsulates the array of micro-relays. The micro-relay switch array may further comprise an array of through-substrate vias (TSVs) associated with the array of micro-relays, arranged such that columns of TSVs alternate with columns of micro-relays, and a plurality of device electrical conductors, each of which electrically couples one of the TSVs of the array of TSVs directly to at least two of the micro-relays.

The micro-relay switch array may further comprise a plurality of TSV electrical conductors, each of which electrically couples to at least one TSV. The substrate may be a glass substrate, the cap may be a glass cap, and the through-substrate vias may be through-glass vias (TGVs). Each micro-relay of the array of micro-relays may be a micro-electromechanical system (MEMS) switch. The array of micro-relays may be arranged in a set of micro-relay columns, and the array of TSVs may be arranged in a set of TSV columns that alternate with the micro-relay columns.

In an embodiment, each TSV may be electrically coupled to (i) at least one micro-relay from a column immediately preceding the TSV's column, and (ii) at least one micro-relay from a column immediately following the TSV's column. The array of micro-relays may be arranged in a set of micro-relay columns and micro-relay rows, the array of TSVs may be arranged in a set of TSV columns and TSV rows, the micro-relay columns may alternate with the micro-relay columns, and the micro-relay rows may alternate with the TSV rows.

Each TSV may be electrically coupled to (i) at least one micro-relay from a row immediately above the TSV's row, (ii) at least one micro-relay from a row immediately below the TSV's row, (iii) at least one micro-relay from a column immediately preceding the TSV's column, and (iv) at least one micro-relay from a column immediately following the TSV's column.

At least one TSV may be formed in the cap. At least one TSV may be formed in the substrate. In one embodiment, the plurality of TSV electrical conductors not disposed on the glass substrate. At least one of the plurality of TSV electrical conductors may electrically couple all of the TSVs in one of the TSV columns.

In another aspect, the invention may be a micro-relay assembly, comprising a micro-relay switch array and a host platform. The micro-relay switch array may comprise an array of micro-relays disposed on a substrate, and an array of through-substrate vias (TSVs) associated with the array of micro-relays, arranged such that columns of TSVs alternate with columns of micro-relays. The micro-relay assembly may further comprise a plurality of device electrical conductors, each of which electrically couples one of the TSVs of the array of TSVs directly to at least two of the micro-relays.

The host platform may be configured to couple to the micro-relay switch array. The host platform may comprise a plurality of TSV electrical conductors, each of which electrically couples at least two TSVs together.

Each micro-relay of the array of micro-relays may be a micro-electromechanical system (MEMS) switch. At least one of the plurality of TSV electrical conductors may electrically couple all of the TSVs in one of the TSV columns. The substrate may be a glass substrate, the cap may be a glass cap, and the through-substrate vias may be through-glass vias (TGVs).

In another aspect, the invention may be a method of fabricating a micro-relay switch array that comprises disposing an array of micro-relays on a substrate, forming an array of through-substrate vias (TSVs) associated with the array of micro-relays such that columns of TSVs alternate with columns of micro-relays, and electrically coupling each of the TSVs of the array of TSVs directly to at least two of the micro-relays.

The method of fabricating a micro-relay switch array may further comprise arranging the array of micro-relays in a set of micro-relay columns, and arranging the array of TSVs is arranged in a set of TSV columns that alternate with the micro-relay columns. The method may further comprise electrically coupling each TSV to (i) at least one micro-relay from a column immediately preceding the TSV's column, and (ii) at least one micro-relay from a column immediately following the TSV's column. The method may further comprise coupling the micro-relay switch array to a host platform. The host platform may comprise a plurality of TSV electrical conductors, each of which electrically couples at least two TSVs together.

BRIEF DESCRIPTION OF THE DRAWINGS

The patent or application file contains at least one drawing executed in color. Copies of this patent or patent application publication with color drawing(s) will be provided by the Office upon request and payment of the necessary fee.

The foregoing will be apparent from the following more particular description of example embodiments, as illustrated in the accompanying drawings in which like reference characters refer to the same parts throughout the different views. The drawings are not necessarily to scale, emphasis instead being placed upon illustrating embodiments.

DETAILED DESCRIPTION

A description of example embodiments follows.

The teachings of all patents, published applications and references cited herein are incorporated by reference in their entirety.

The described embodiments disclose a distributed switch array device, with multiple input/output ports, configured to accommodate AC/DC high-current and high-power electrical circuit architectures. Rather than connecting switches of the array together with electrically conductive interconnect materials on the device substrate, the described embodiments situate through-substrate vias local to individual switches or small groups of switches. It should be understood that the term "through-substrate via" (TSV) as used herein, is intended to encompass vias that pass through the device substrate as well as through the cap or package material that joins with the device substrate to form a sealed package to isolate the switch device from the external environment. The example embodiments described herein employ glass substrates and caps, and utilize through-glass vias (TGVs) to convey electrical signals into and out of the package formed by the glass substrate and cap, although it should be understood that the concepts described with respect to TGVs also apply to TSVs in general.

The TGVs (or through-substrate vias in general) may then be electrically coupled to each other away from the device substrate, thereby relocating heat dissipation away from the substrate. One benefit of doing so is a more even current and thermal distribution associated with the switch array device. The underlying switch array can be smaller and more compact, since the heavy current-carrying interconnect materials have been migrated away from the device substrate. Further, placing the TGVs close to the switches facilitates efficiently moving heat out of and away from the switches.

Figure 2A:
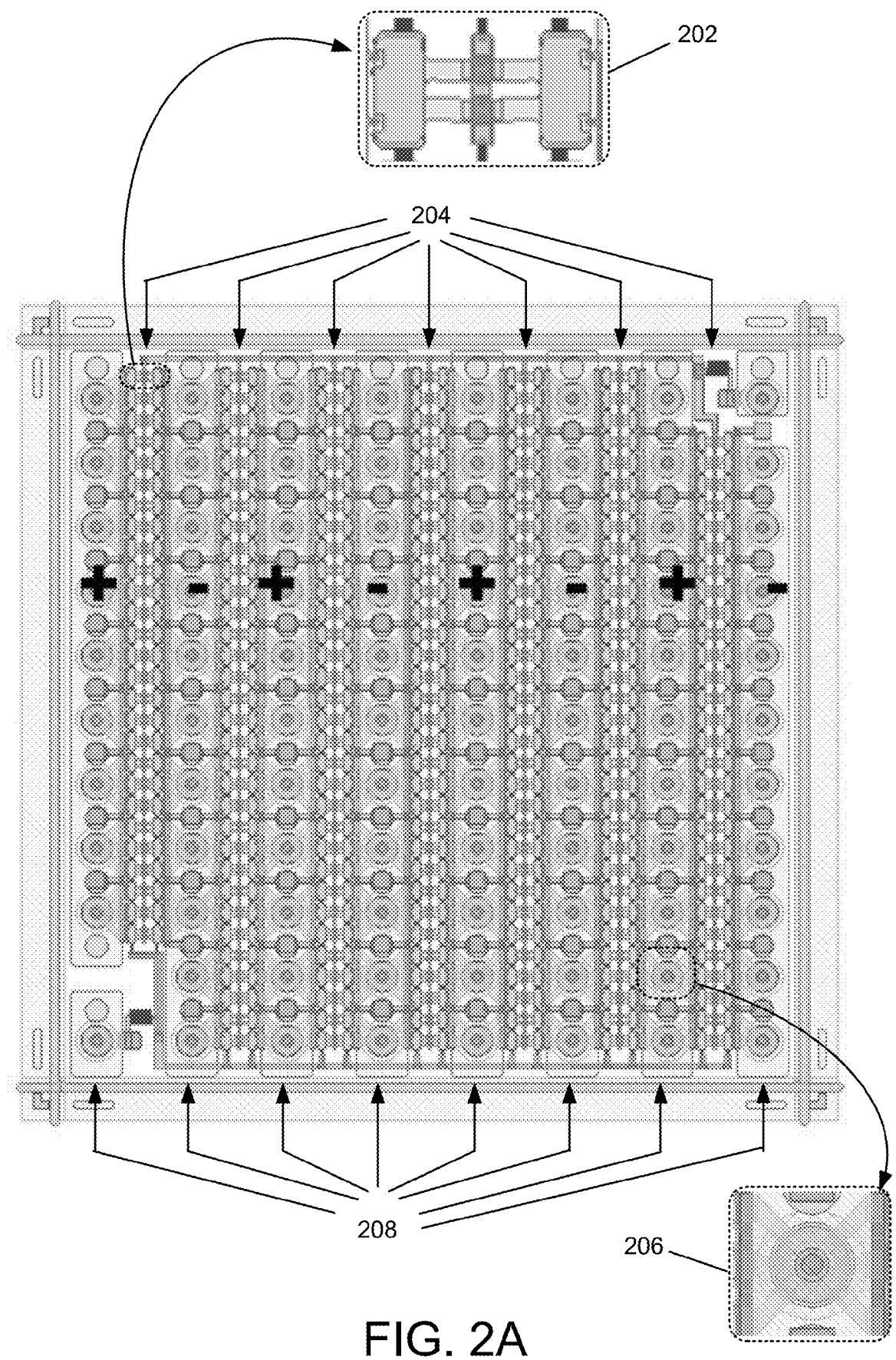
FIGS. 2A and 2B illustrate one example embodiment of a switch array device constructed and arranged according to the invention.
Figure 2B:
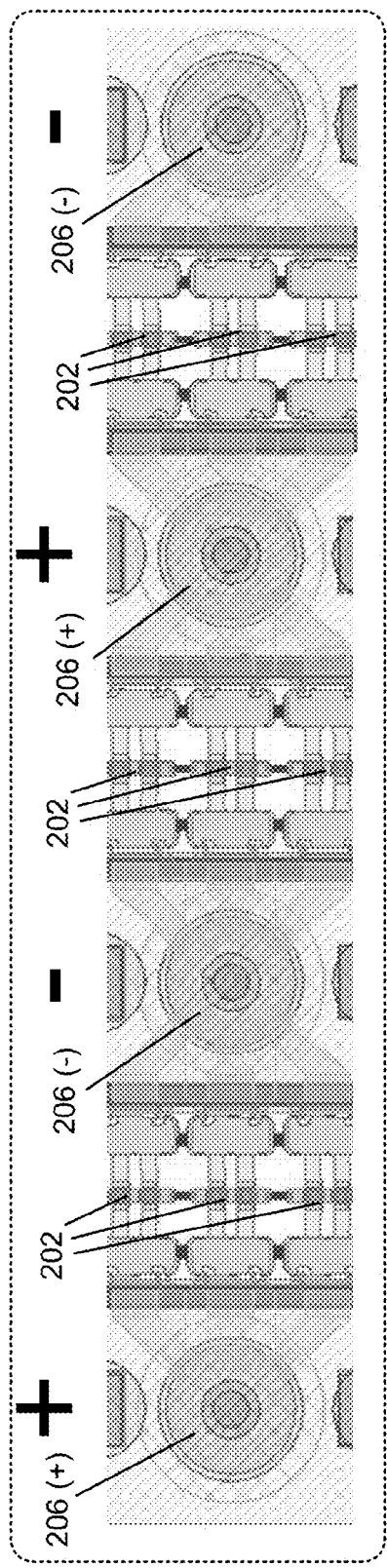
Figure 2B:
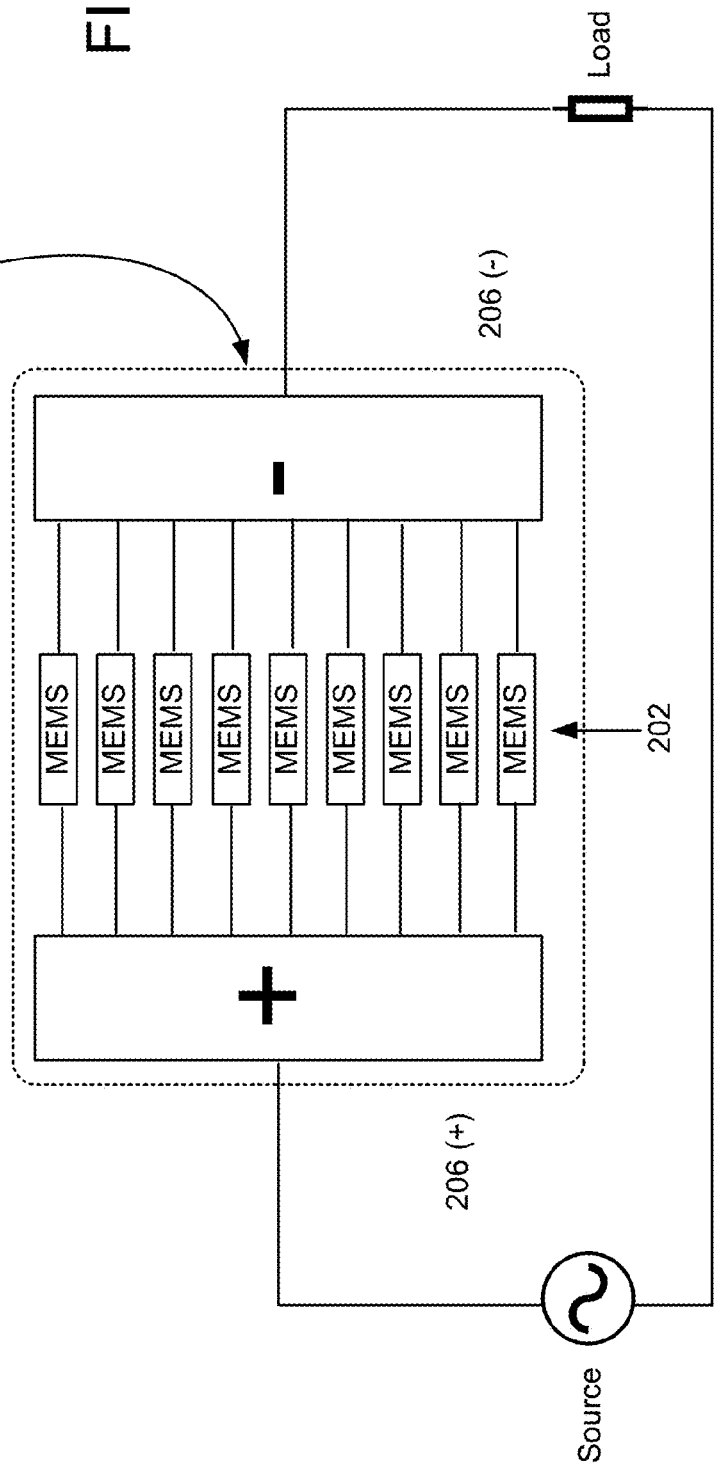

FIGS. 2A and 2B illustrate one example embodiment of a switch array device constructed and arranged according to the invention. FIG. 2A shows an array of MEMS switches 202 arranged in columns 204. FIG. 2A further shows an array of TGVs 206 also arranged in columns 208. An example MEMS switch 202 and TGV 206 are shown in an expanded view in FIG. 2A. The example array of MEMS switches 202 may be disposed on a glass substrate, and encapsulated within a glass cover or cap resulting in a MEMS switch array device. The TGVs 206 provide an electrical connection from the encapsulated MEMS switches 202 through the glass cap, the glass substrate, or both, to components external to the MEMS switch array device.

The columns 208 of TGVs 206 are shown labeled with either a plus (+) or minus (−). Each MEMS switch 202 is connected to a "+" column TGV on one side and a "−" column TGV on the other side. In operation, all of the "+"

TGVs are electrically coupled together, and all of the "−" TGVs are electrically coupled together. The electrical coupling of the TGVs may be accomplished within the MEMS switch array device or outside of the of the MEMS switch array device. In at least one embodiment, the TGVs 206 in each individual column are electrically coupled together within the encapsulated switch array. In other embodiments, the electrical coupling of the individual TGVs may occur outside of the encapsulated switch array. With the arrangement depicted in FIG. 2A, current of a particular TGV may flow to (or from) a TGV on either side (e.g., the left side and the right side as depicted in FIG. 2A) of the particular TGV.

Figure 1:
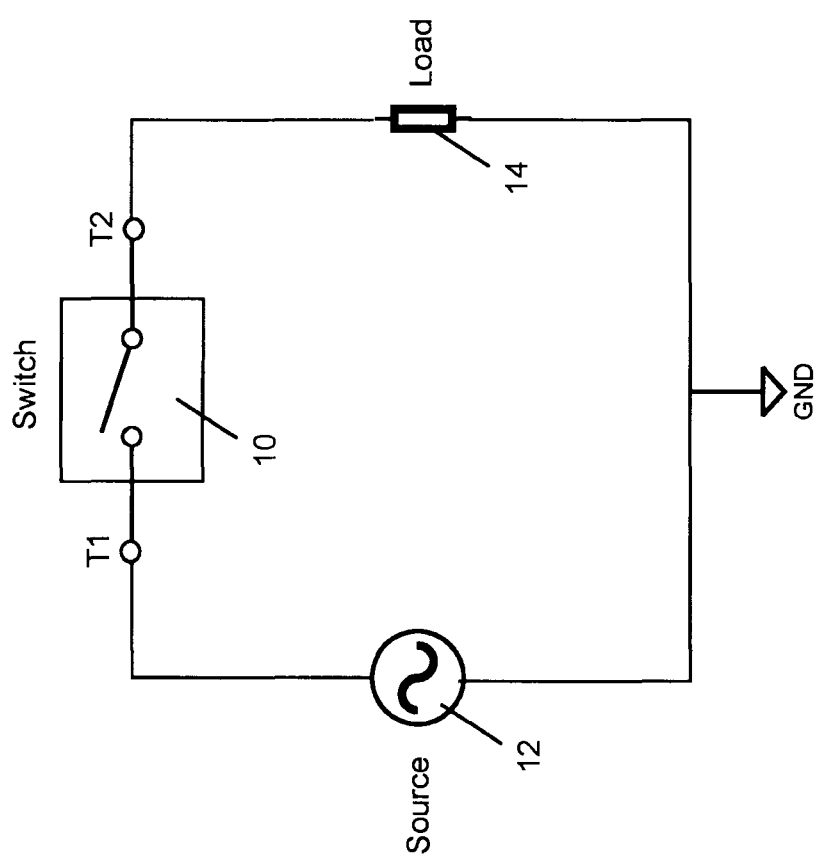
FIG. 1 shows a mechanical switch employed to selectively direct electrical current from an electrical source to a load.

The upper portion of FIG. 2B illustrates an example group of MEMS switches 202 and TGVs 206 from a row of the switch array shown in FIG. 2A. This example includes nine MEMS switches 202 and four TGVs 206. With the "+" TGVs 206(+) electrically coupled together and the "−" TGVs 206(−) electrically coupled together, a parallel-connected group of MEMS switches is formed, as shown in the bottom portion of FIG. 2B. This parallel group of MEMS switches may be used to control current flow from a source to a load, as described with respect to FIG. 1. Including all of the rows of a switch array may facilitate a parallel group of hundreds or even thousands of MEMS switches.

Figure 2C:
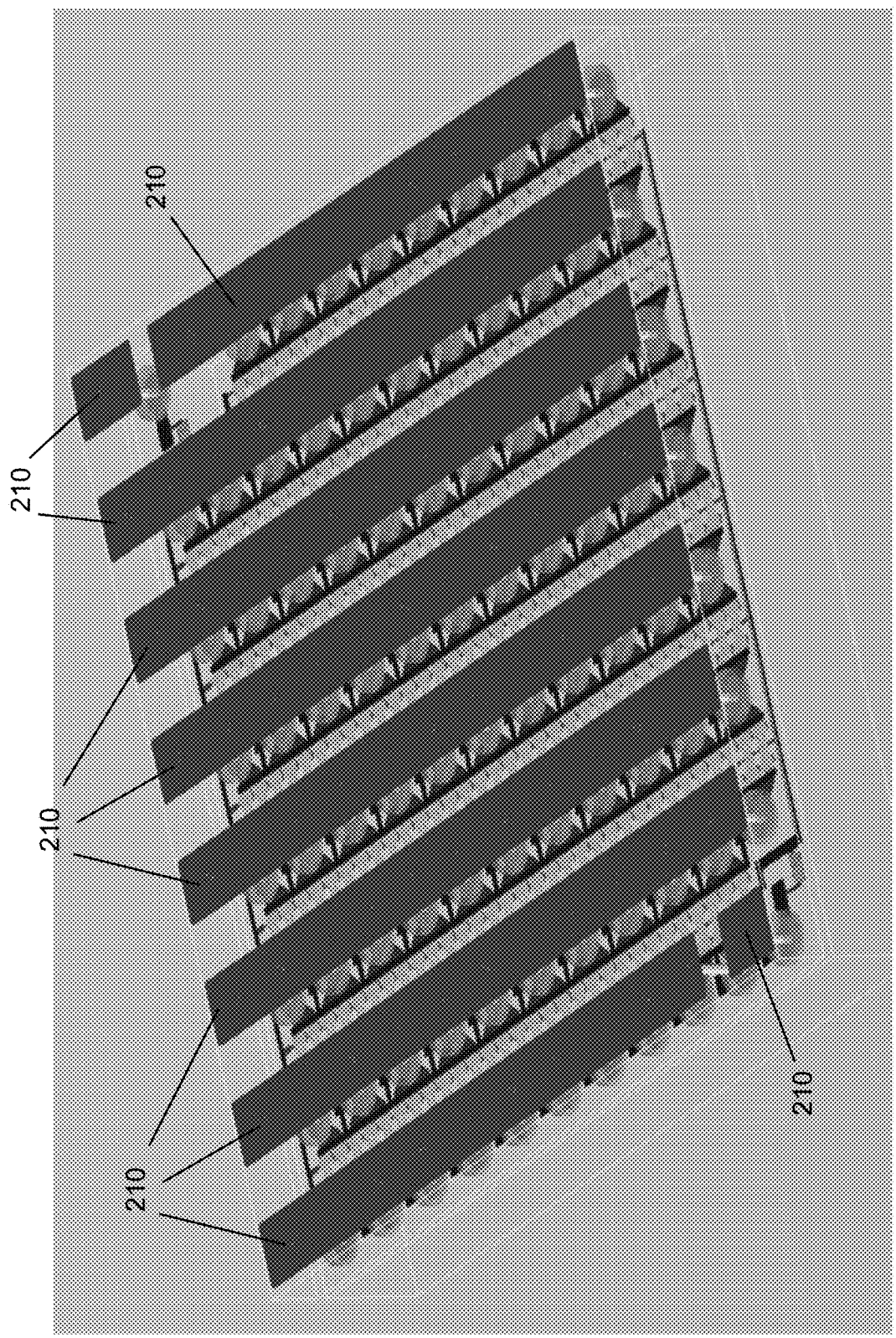
FIG. 2C illustrates a three-dimensional view of the switch array device shown in FIG. 2A.

FIG. 2C illustrates a three-dimensional (3D) view of the switch array device shown in FIG. 2A. The solid bars 210 shown on the top of the array in FIG. 2C are electrically conductive strips, each of which electrically couples all the TGVs 206 in a particular column. In an application for which the switch array is to be mounted on a substrate, metal frame or PCB, where each individual TGV is connected to the external connectors, the conductive strips can be segmented into arrays of pieces instead of a continuous column.

Figure 3A:
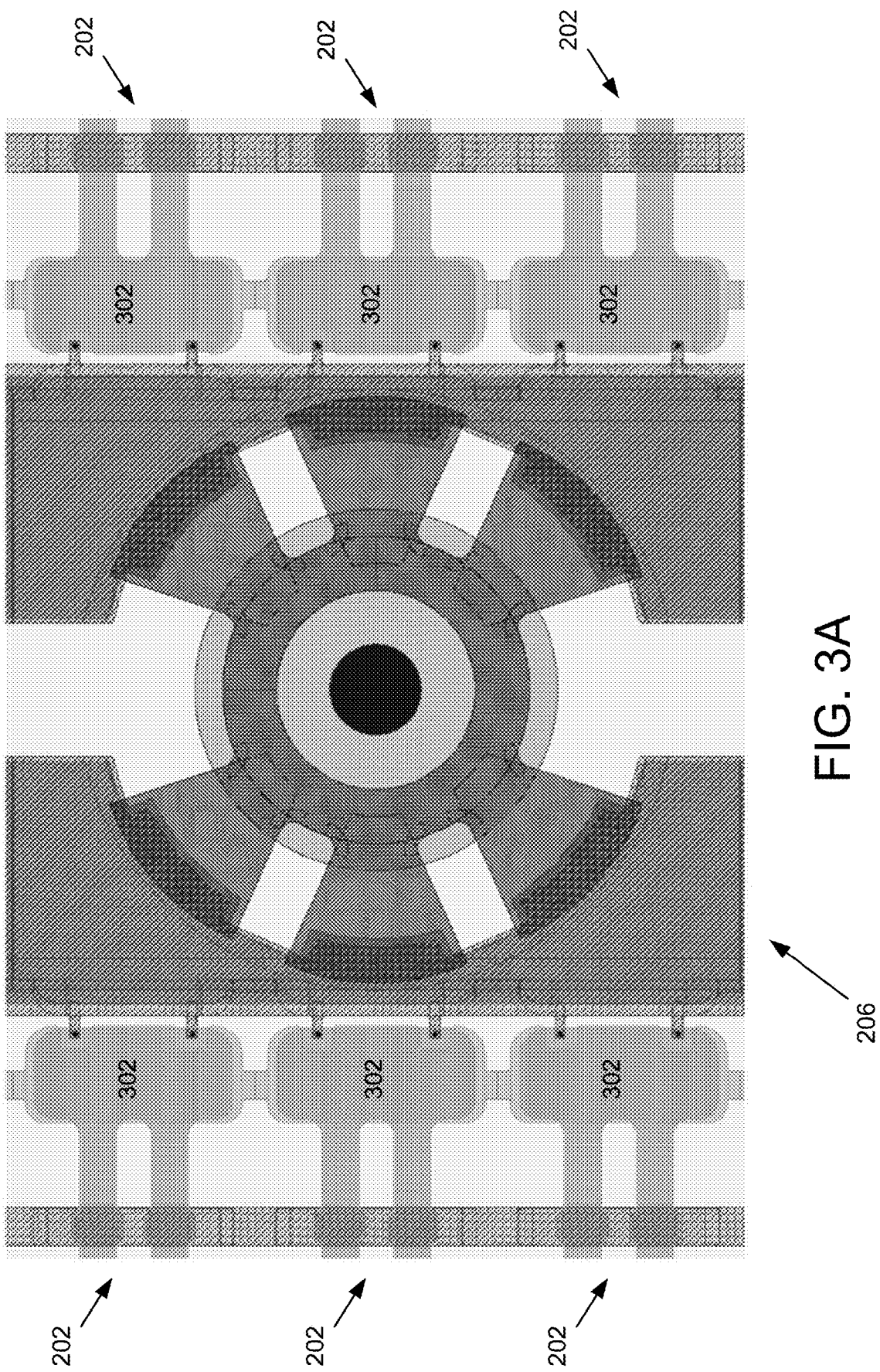
FIG. 3A illustrates an expanded view of one local through-substrate via from the array depicted in FIG. 2A.
Figure 3B:
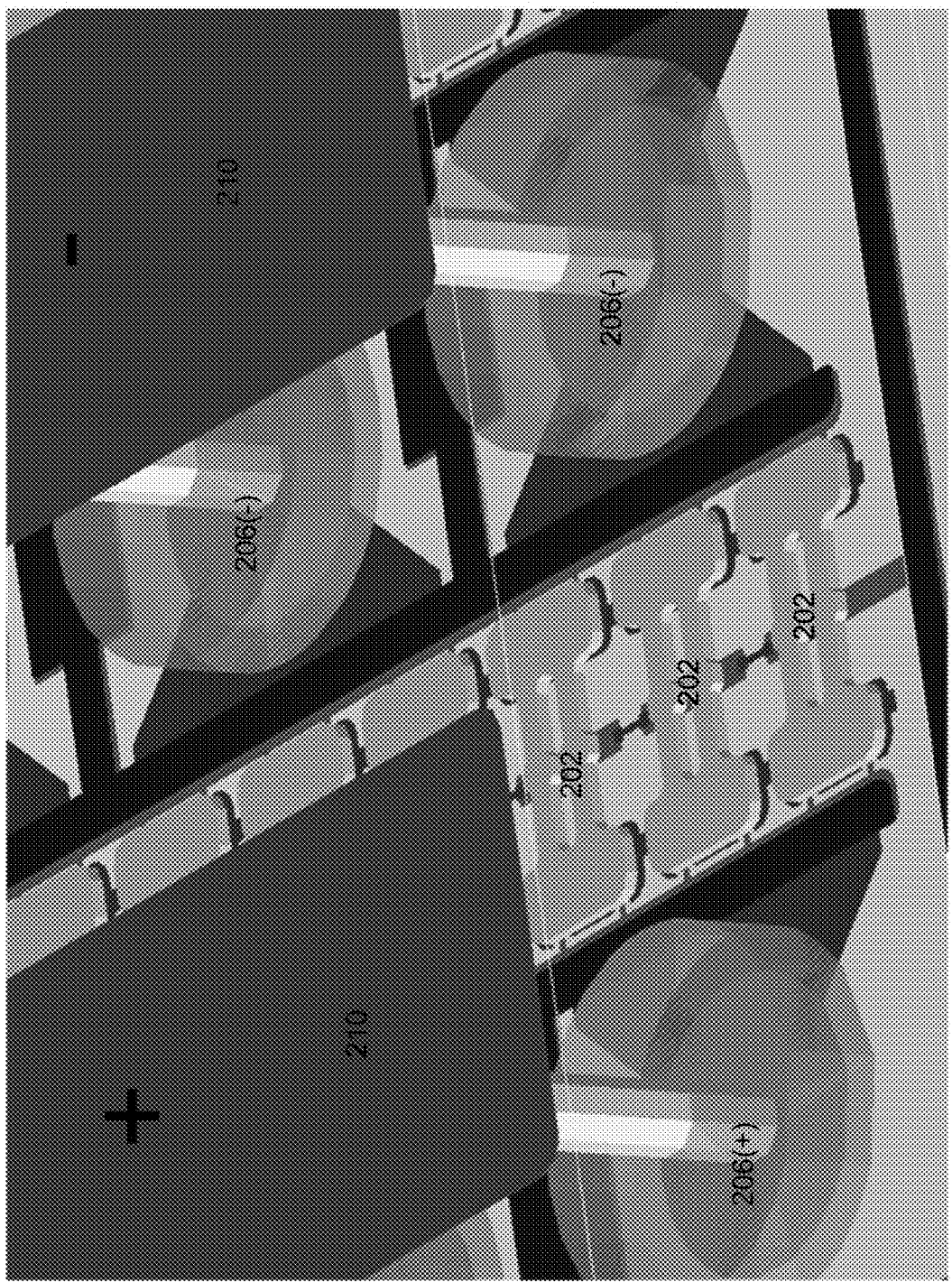
FIG. 3B shows an expanded view of a portion of the three-dimensional view shown in FIG. 2C.

FIG. 3A illustrates an expanded view of one TGV 206 from the array depicted in FIG. 2A. FIG. 3A shows how one TGV 206 connects to its neighboring contacts 302 of MEMS switches 202, and how the switch contacts connect input and output terminal through the TGVs 206. FIG. 3B shows an expanded view of a portion of the three-dimensional view shown in FIG. 2C. FIG. 3B shows conductive strips 310 that electrically couple together, on the substrate, the TGVs within a particular row, although it should be understood that in other embodiments the on-substrate conductors may not be implemented (e.g., the on-substrate conductors may be segmented to individual TGVs or eliminated altogether, in favor of TGVs connected to one another external to the switch array device).

Figure 4A:
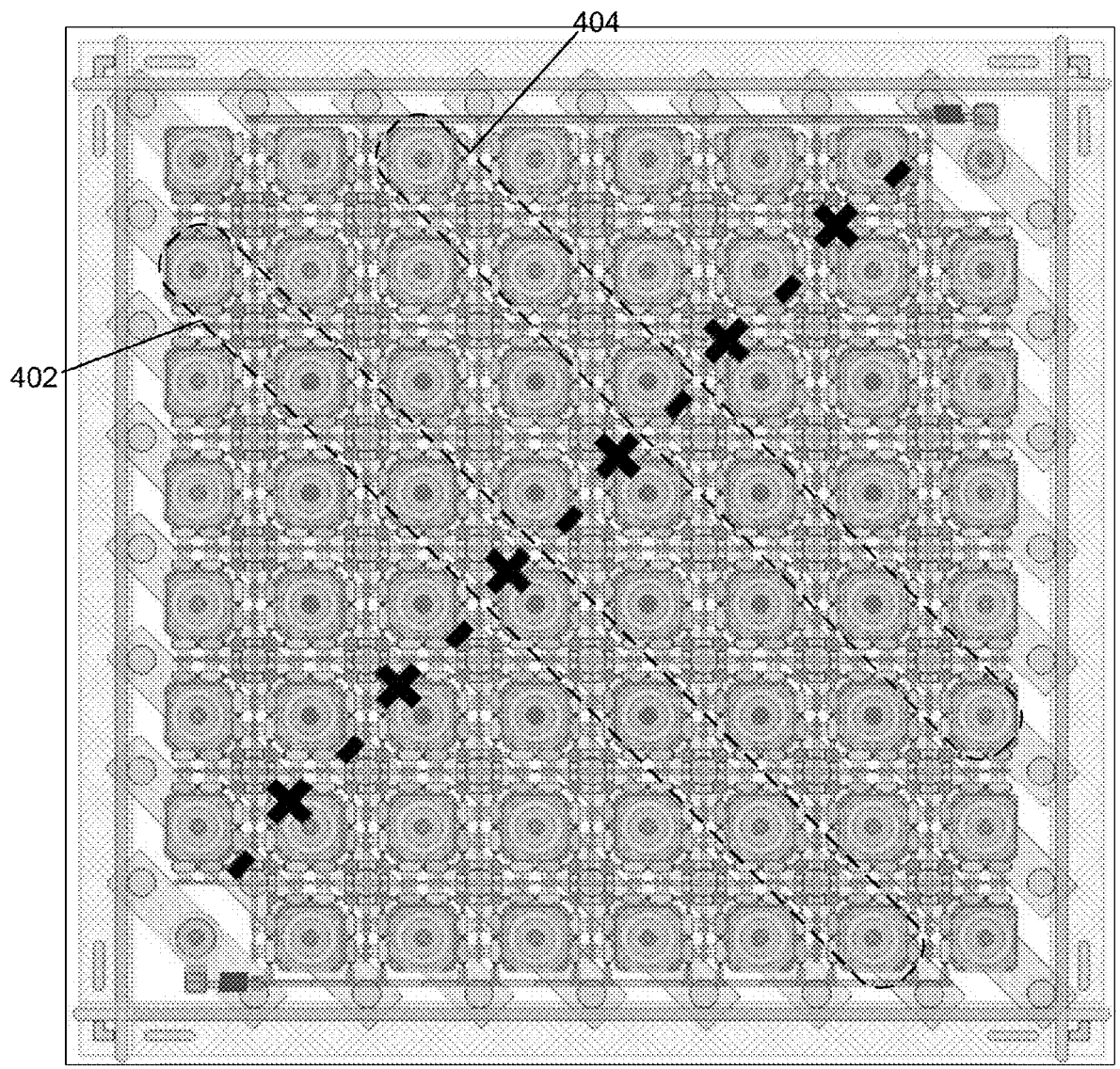
FIG. 4A illustrates an alternative example embodiment arranged and constructed according to the invention.

FIG. 4A illustrates an alternative example embodiment arranged and constructed according to the invention. In the arrangement shown in FIG. 4A, the groups of "+" TGVs 206(+) and "−" TGVs are grouped on a diagonal rather than columns. An example group 402 of "+" TGVs 206 and an example group 404 of "−" TGVs 206 are shown circled with a dotted line. With the diagonal TGV arrangement of FIG. 4A, a TGV of opposite polarity is disposed on all four sides of a particular TGV. Thus, with the arrangement depicted in FIG. 4A, current of a particular TGV may flow to (or from) a TGV on the left, right, bottom, or top of the particular TGV.

Figure 4B:
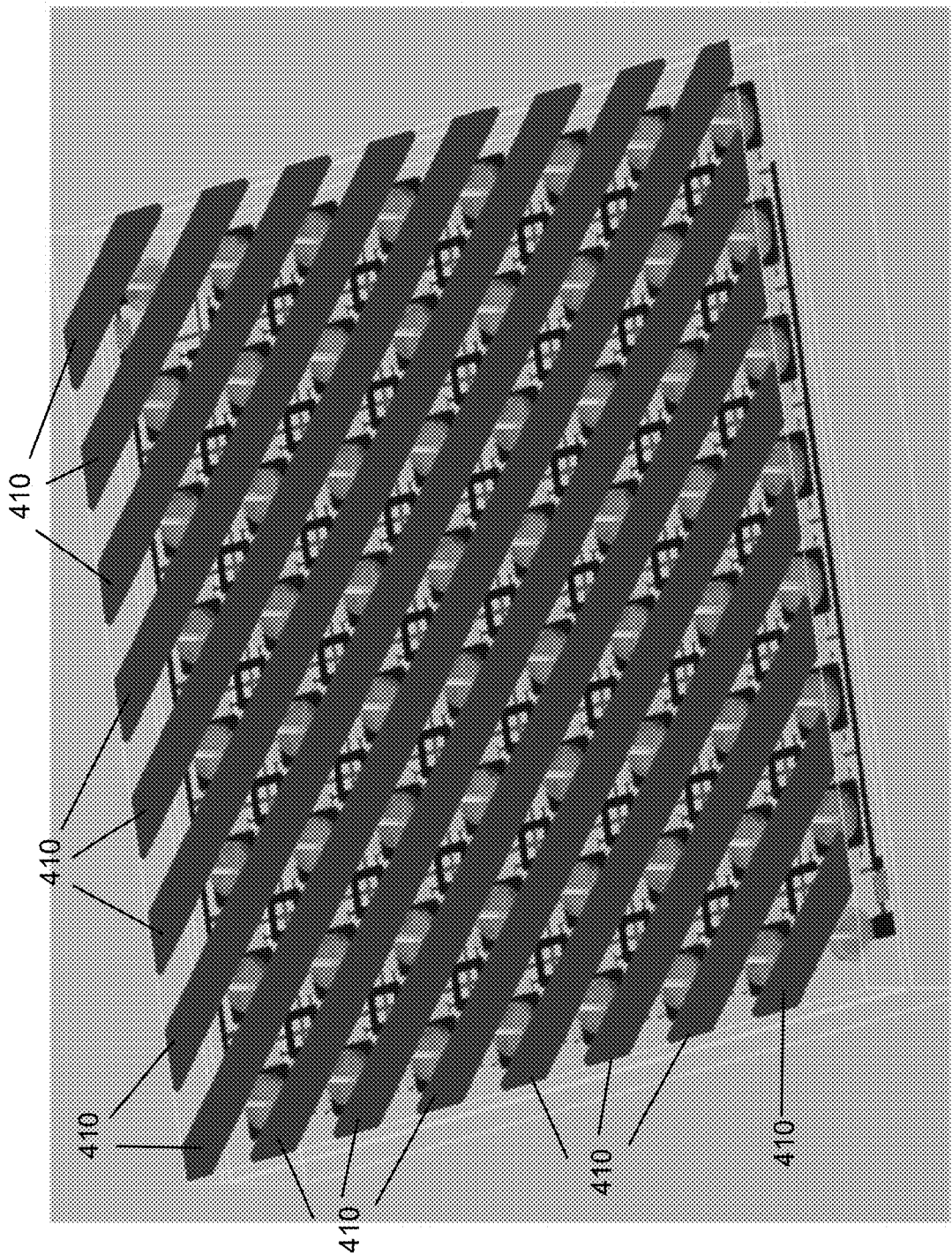
FIG. 4B illustrates a three-dimensional view of the switch array device shown in FIG. 4A.
Figure 5A:
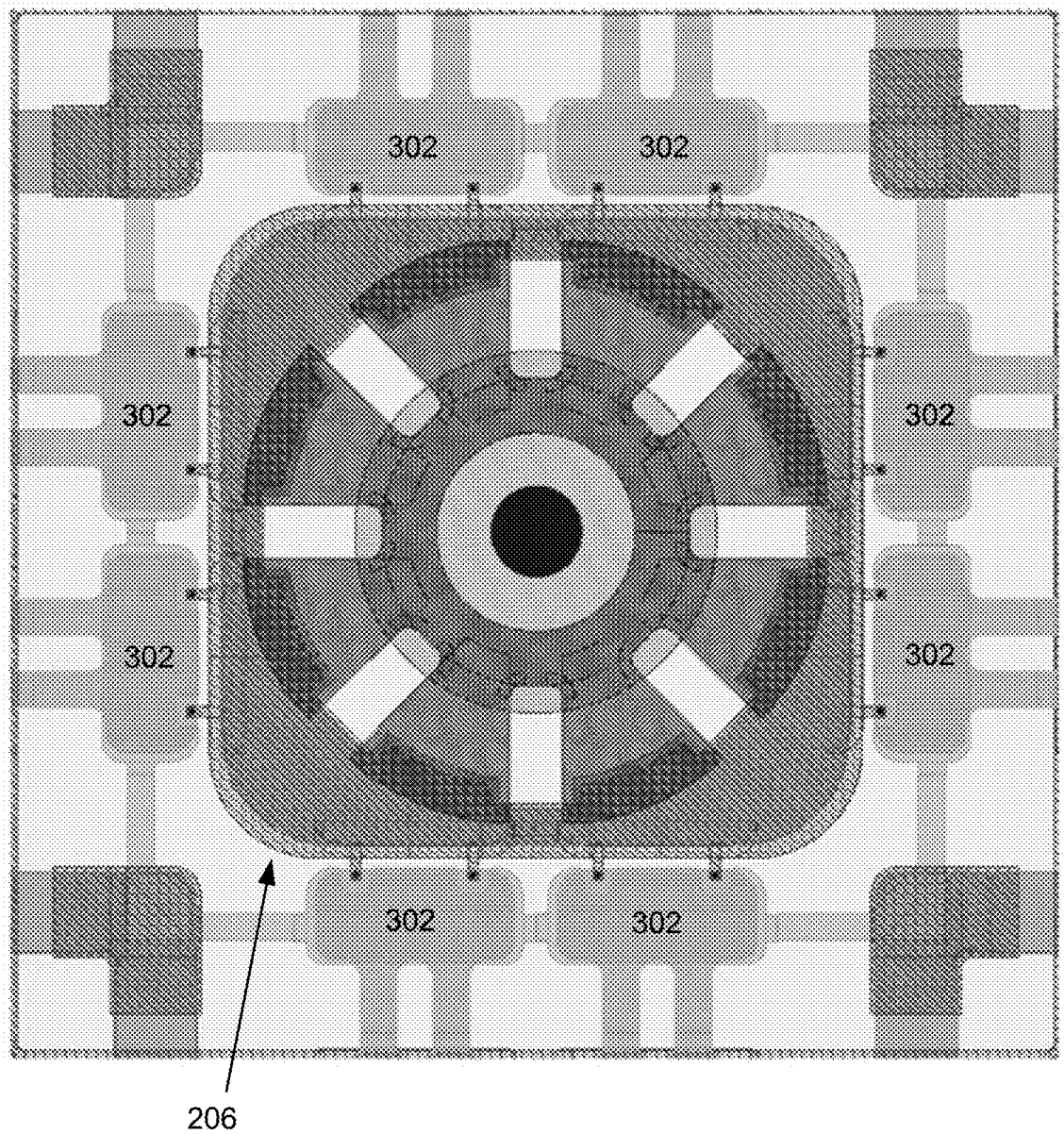
FIG. 5A shows an expanded view of one local through-substrate via from the array depicted in FIG. 4A.
Figure 5B:
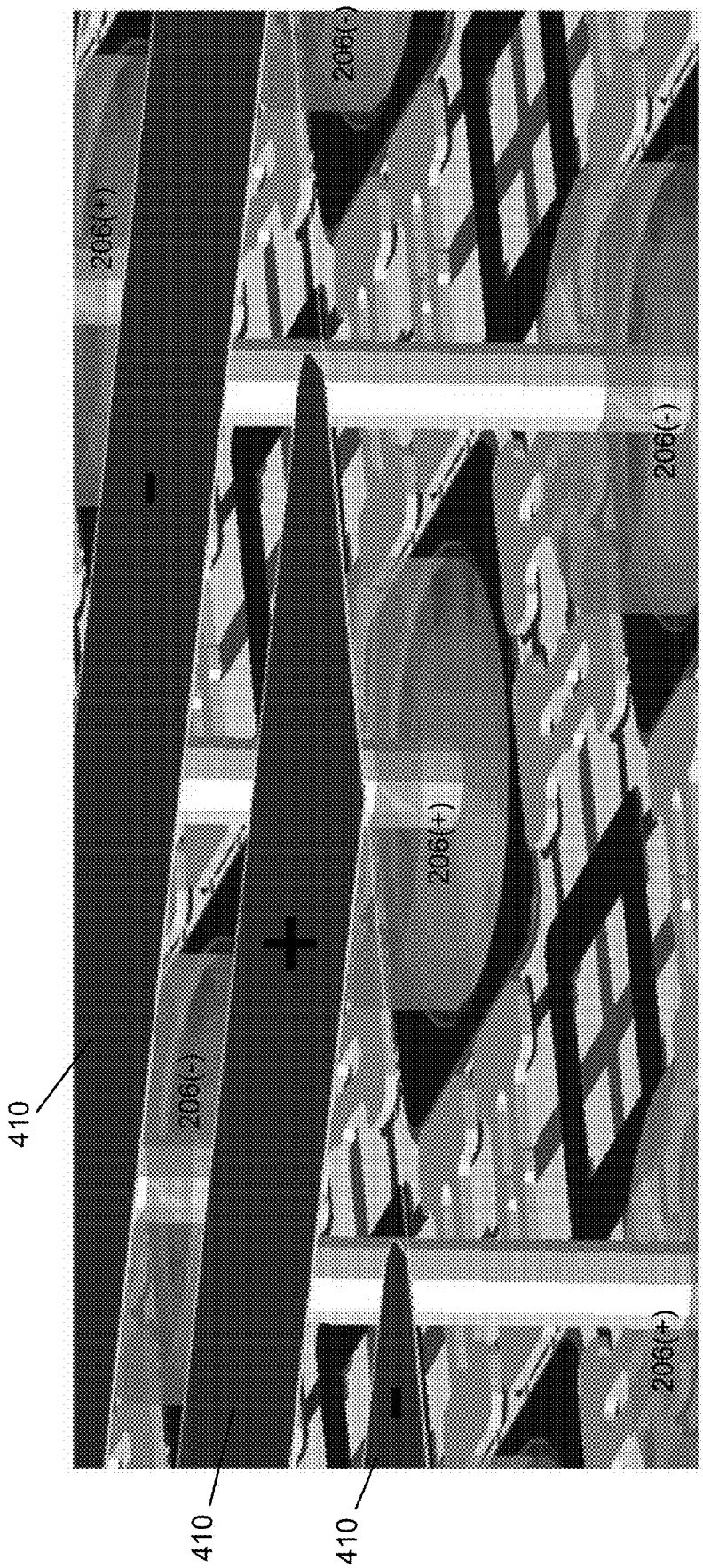
FIG. 5B shows an expanded view of a portion of the three-dimensional view shown in FIG. 4B.

FIG. 4B illustrates a 3D view of the switch array device shown in FIG. 4A. The solid bars 410 shown on the top of the array in FIG. 4B are electrically conductive strips, each of which electrically couples all the TGVs 206 located on a particular diagonal. FIG. 5A shows an expanded view of one TGV 206 from the array depicted in FIG. 4A. FIG. 5A shows how one TGV 206 connects to all four of its neighboring contacts 302 of MEMS switches 202, and how the switch contacts connect input and output terminal through the TGVs 206. FIG. 5B shows an expanded view of a portion of the three-dimensional view shown in FIG. 4B. FIG. 5B shows conductive strips 410 that electrically couple together, on the substrate, the TGVs within a particular row, although it should be understood that in other embodiments the on-substrate conductors may not be implemented (e.g., rather with TGVs connected together external to the switch array device, such as on a printed circuit board). The diagonal strip can be broken up into segments where each segments can associated with only one TGV 206

Figure 6A:
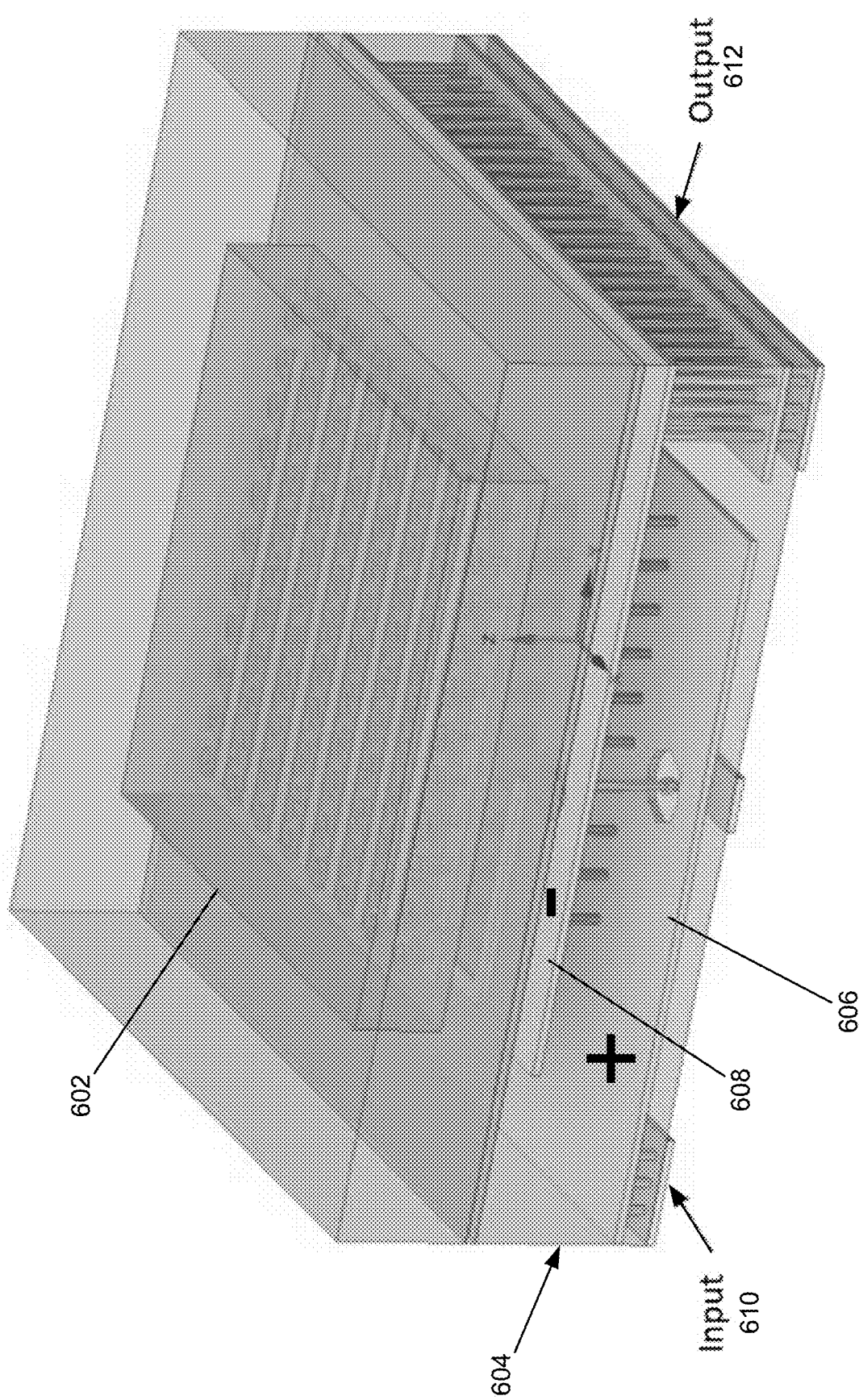
FIGS. 6A and 6B illustrate example embodiments of how a switch array device described herein may be coupled to an external host component according to the invention.
Figure 6B:
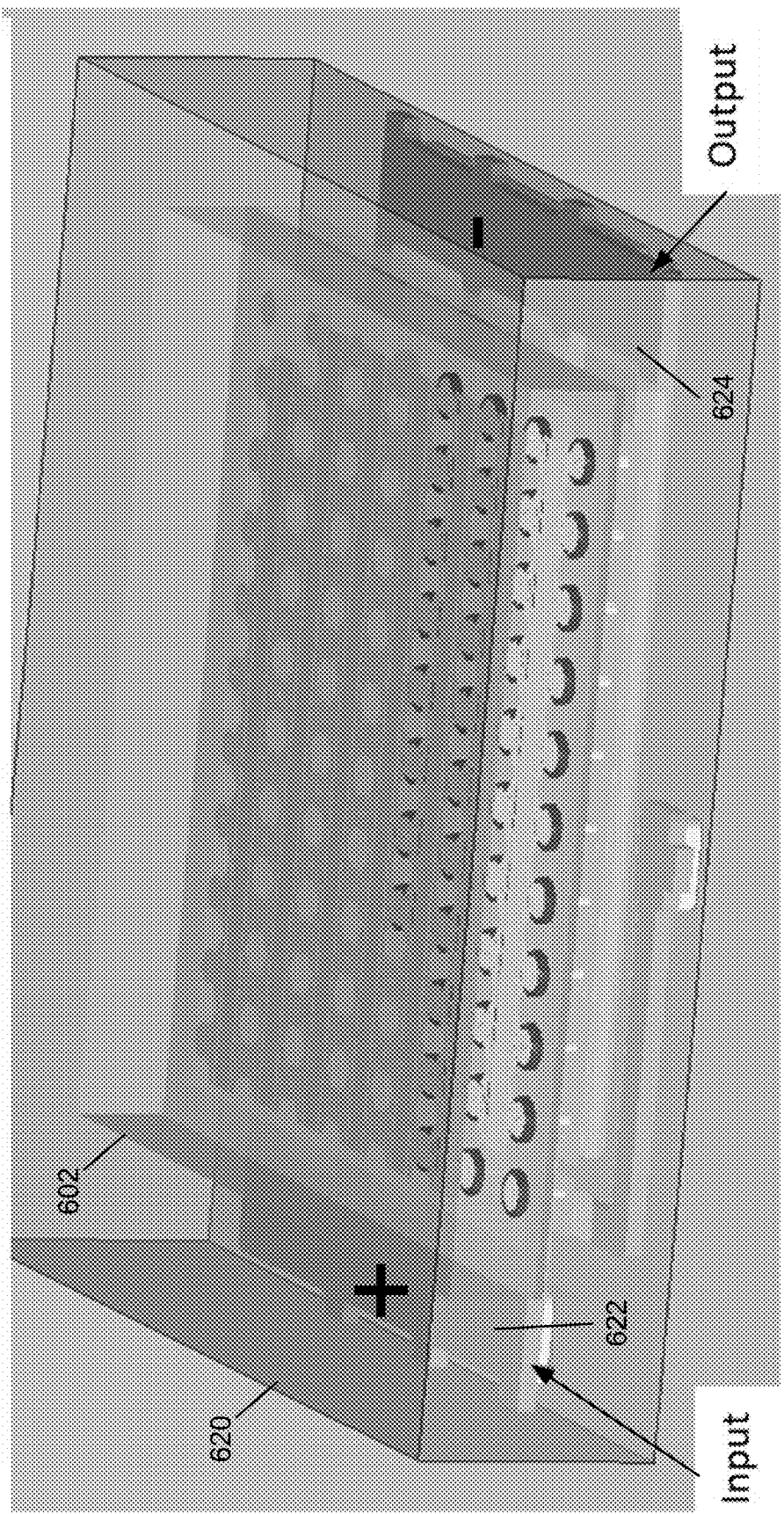

FIGS. 6A and 6B illustrate example embodiments of how a switch array device described herein may be coupled to an external host component. FIG. 6A shows a switch array device 602 in an example multi-layer printed circuit board (PCB) 604. The PCB 604 includes at least two conductive layers 606, 608. A first conductive layer 606 is electrically coupled to alternating columns of the switch array 602 (e.g., the TGVs in the "+" columns) and a second conductive layer 608 is electrically coupled to the remaining columns (e.g., the TGVs in the "−" columns). Conductors from the "+" column TGVs of the switch array to first conductive layer 606 pass through the intervening second conductive layer 608, while being electrically insulated from conductive layer 608, e.g., by passing through holes in the conductive layer 608. An input assembly 610 may be electrically coupled to the first conductive layer 606, so that the input to the switch array device 602 may be implemented by a single electrical contact. Likewise, an output assembly 612 may be electrically coupled to the second conductive layer 608, so that the output to the switch array device 602 may be implemented by a single electrical contact.

FIG. 6B shows a switch array device 602 in an example package module 620 (lead frame design) with a pair of conductive comb structures 622, 624. A first comb structure 622 has conductive "teeth" that extend along and are electrically coupled to alternating columns of the switch array 602 (e.g., the TGVs in the "+" columns), so that all TGVs in those "+" alternating columns are electrically coupled to the base of the comb structure 622. A second comb structure 624 also has conductive "teeth" that extend along and are electrically coupled to the remaining alternating columns of the switch array 602 (e.g., the TGVs in the "−" columns), so that all of the TGVs in those "−" alternating columns are electrically coupled to the base of the comb structure 624. The bases of the comb structures 622, 624 provide single electrical contacts for the input and output of the switch array device 602, respectively.

Figure 7A:
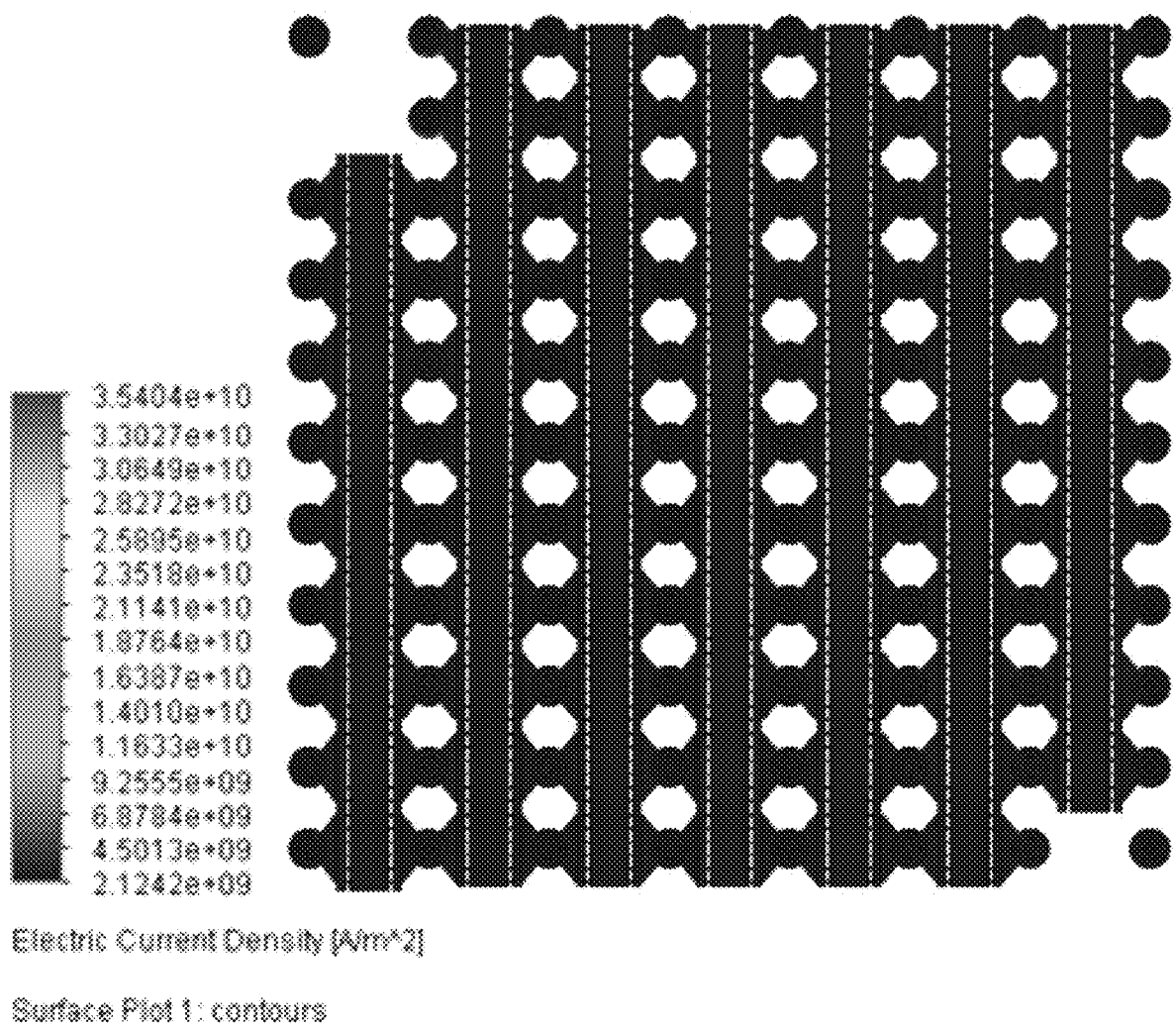
FIGS. 7A and 7B illustrate an electric current density plot of the switch array device configuration shown in FIG. 2A.
Figure 7B:
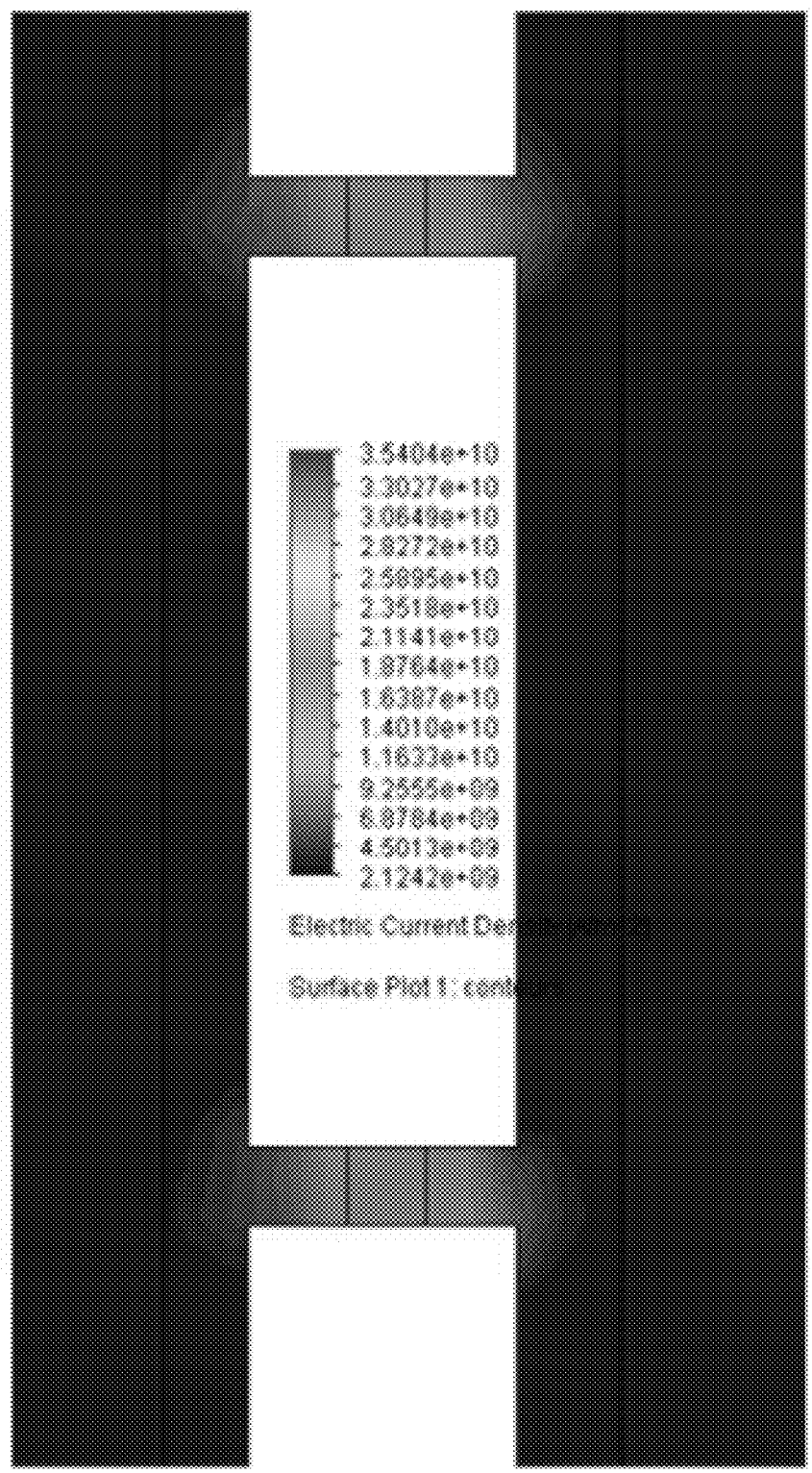

FIG. 7A illustrates an electric current density plot of the switch array device configuration shown in FIG. 2A. FIG. 7A shows a relatively even current distribution across the entire array. FIG. 7B shows that the current density through the MEMS switches 202 themselves is slightly higher than the surrounding TGVs and connecting metals, but still relatively low due to the total current being distributed across many switches in the array.

Figure 8A:
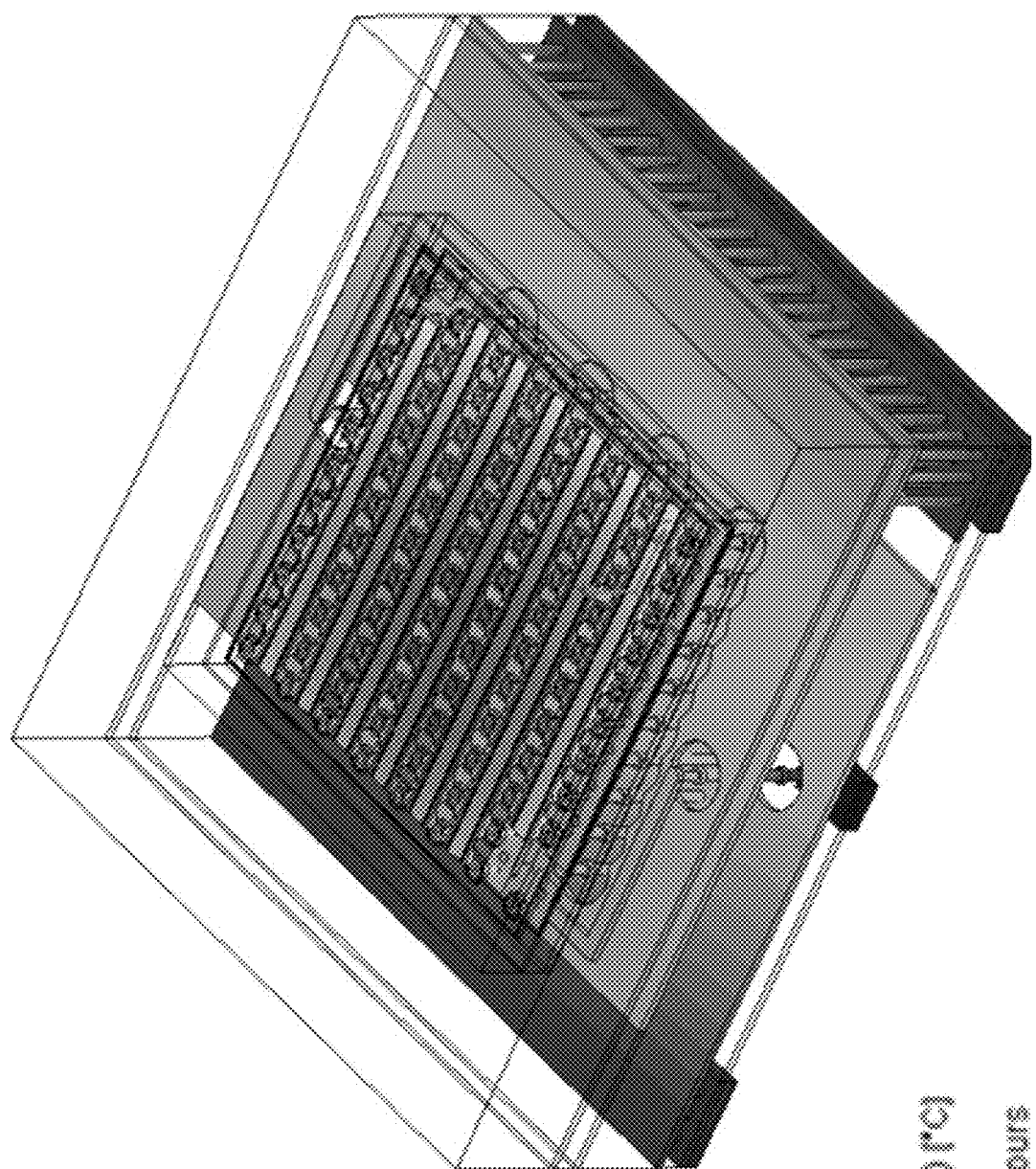
FIGS. 8A and 8B show a temperature plot of the switch array device configuration shown in FIG. 2A.
Figure 8B:
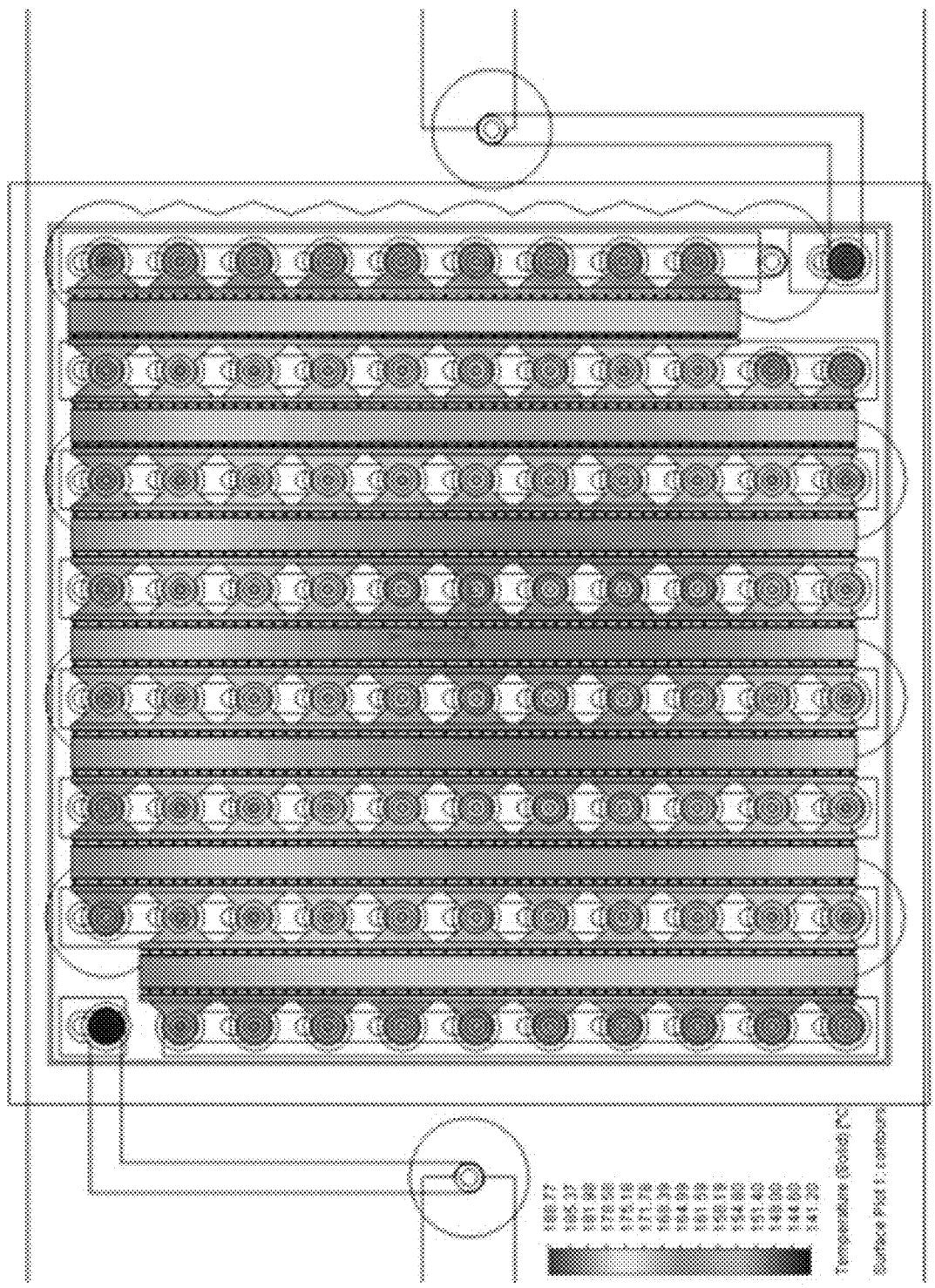

FIGS. 8A and 8B show a temperature plot of the switch array device configuration shown in FIG. 2A, mounted on a PCB platform as depicted in FIG. 6A, with a 10A input current. FIG. 8A is a 3D perspective view of the entire device/PCB assembly, while FIG. 8B a top view of the switch array. FIGS. 8A and 8B demonstrate that the temperature is well distributed across the switch array. While the center region of the array shows a higher temperature profile as compared to the perimeter of the array, no concentrated hot spots are evident.

While example embodiments have been particularly shown and described, it will be understood by those skilled in the art that various changes in form and details may be made therein without departing from the scope of the embodiments encompassed by the appended claims.

What is claimed is:

1. A micro-relay switch array, comprising:
an array of micro-relays disposed on a substrate;
a cap disposed over the array of micro-relays, thereby encapsulating the array of micro-relays;
an array of through-substrate vias (TSVs) associated with the array of micro-relays, arranged such that columns of TSVs alternate with columns of micro-relays; and
a plurality of device electrical conductors, each of which electrically couples one of the TSVs of the array of TSVs directly to at least two of the micro-relays.

2. The micro-relay switch array of claim 1, further comprising a plurality of TSV electrical conductors, each of which is electrically coupled to at least one TSV.

3. The micro-relay switch array of claim 2, wherein the plurality of TSV electrical conductors are not disposed on the glass substrate.

4. The micro-relay switch array of claim 2, wherein at least one of the plurality of TSV electrical conductors electrically couples all of the TSVs in one of the TSV columns.

5. The micro-relay switch array of claim 1, wherein the substrate is a glass substrate, the cap is a glass cap, and the through-substrate vias are through-glass vias (TGVs).

6. The micro-relay switch array of claim 1, wherein each micro-relay of the array of micro-relays is a micro-electromechanical system (MEMS) switch.

7. The micro-relay switch array of claim 1, wherein the array of micro-relays is arranged in a set of micro-relay columns, and the array of TSVs is arranged in a set of TSV columns that alternate with the micro-relay columns.

8. The micro-relay switch array of claim 7, wherein each TSV is electrically coupled to (i) at least one micro-relay from a column immediately preceding the TSV's column, and (ii) at least one micro-relay from a column immediately following the TSV's column.

9. The micro-relay switch array of claim 1, wherein the array of micro-relays is arranged in a set of micro-relay columns and micro-relay rows, the array of TSVs is arranged in a set of TSV columns and TSV rows, and wherein the micro-relay columns alternate with the micro-relay columns, and the micro-relay rows alternate with the TSV rows.

10. The micro-relay switch array of claim 9, wherein each TSV is electrically coupled to (i) at least one micro-relay from a row immediately above the TSV's row, (ii) at least one micro-relay from a row immediately below the TSV's row, (iii) at least one micro-relay from a column immediately preceding the TSV's column, and (iv) at least one micro-relay from a column immediately following the TSV's column.

11. The micro-relay switch array of claim 1, wherein at least one TSV is formed in the cap.

12. The micro-relay switch array of claim 1, wherein at least one TSV is formed in the substrate.

13. A micro-relay assembly, comprising:
a micro-relay switch array, comprising:
an array of micro-relays disposed on a substrate;
an array of through-substrate vias (TSVs) associated with the array of micro-relays, arranged such that columns of TSVs alternate with columns of micro-relays;
a plurality of device electrical conductors, each of which electrically couples one of the TSVs of the array of TSVs directly to at least two of the micro-relays;
a host platform configured to couple to the micro-relay switch array, the host platform comprising a plurality of TSV electrical conductors, each of which electrically couples at least two TSVs together.

14. The micro-relay assembly of claim 13, wherein each micro-relay of the array of micro-relays is a micro-electromechanical system (MEMS) switch.

15. The micro-relay assembly of claim 13, wherein at least one of the plurality of TSV electrical conductors electrically couples all of the TSVs in one of the TSV columns.

16. The micro-relay assembly of claim 13, wherein the substrate is a glass substrate, the cap is a glass cap, and the through-substrate vias are through-glass vias (TGVs).

17. A method of fabricating a micro-relay switch array, comprising:
disposing an array of micro-relays on a substrate;
forming an array of through-substrate vias (TSVs) associated with the array of micro-relays such that columns of TSVs alternate with columns of micro-relays; and
electrically coupling each of the TSVs of the array of TSVs directly to at least two of the micro-relays.

18. The method of claim 17, further comprising arranging the array of micro-relays in a set of micro-relay columns, and arranging the array of TSVs is arranged in a set of TSV columns that alternate with the micro-relay columns.

19. The method of claim 18, further comprising electrically coupling each TSV to (i) at least one micro-relay from a column immediately preceding the TSV's column, and (ii) at least one micro-relay from a column immediately following the TSV's column.

20. The method of claim 17, further comprising coupling the micro-relay switch array to a host platform, the host platform comprising a plurality of TSV electrical conductors, each of which electrically couples at least two TSVs together.

* * * * *